United States Patent
Tower et al.

[11] Patent Number: 6,020,628
[45] Date of Patent: Feb. 1, 2000

[54] OPTICAL COMPONENT PACKAGE WITH A HERMETIC SEAL

[75] Inventors: Steven A. Tower, North Dartmouth, Mass.; Brian Mravic, North Haven, Conn.

[73] Assignee: Olin Corporation, New Bedford, Mass.

[21] Appl. No.: 09/118,638

[22] Filed: Jul. 17, 1998

Related U.S. Application Data

[60] Provisional application No. 60/053,205, Jul. 21, 1997.

[51] Int. Cl.$^7$ .................................................. H01L 23/02
[52] U.S. Cl. ......................... 257/680; 257/434; 257/437; 438/27; 438/65; 438/116
[58] Field of Search ...................................... 257/680, 433, 257/434, 435, 437, 99; 438/27, 64, 65, 116

[56] References Cited

U.S. PATENT DOCUMENTS

| | | | |
|---|---|---|---|
| 4,611,400 | 9/1986 | Drake | 30/353 |
| 4,650,285 | 3/1987 | Stevenson | 257/680 |
| 4,727,457 | 2/1988 | Thillays | 362/582 |
| 4,826,276 | 5/1989 | Abbott et al. | 350/96.2 |
| 4,866,571 | 9/1989 | Butt | 361/386 |
| 4,897,711 | 1/1990 | Blonder et al. | 257/432 |
| 4,989,930 | 2/1991 | Nakagawa et al. | 257/680 |
| 5,011,256 | 4/1991 | Johnson et al. | 257/433 |
| 5,014,159 | 5/1991 | Butt | 361/386 |
| 5,014,418 | 5/1991 | Wright | 29/827 |
| 5,029,968 | 7/1991 | Geiser, Jr. et al. | 350/96.2 |
| 5,110,307 | 5/1992 | Rapoza | 439/566 |
| 5,132,532 | 7/1992 | Watanabe | 257/433 |
| 5,143,531 | 9/1992 | Kramer | 65/3.11 |
| 5,177,806 | 1/1993 | Abbott et al. | 385/76 |
| 5,293,439 | 3/1994 | Mori et al. | 385/41 |
| 5,399,805 | 3/1995 | Tyler et al. | 257/680 |
| 5,405,272 | 4/1995 | Rapoza | 439/566 |
| 5,606,635 | 2/1997 | Haake | 385/53 |
| 5,731,602 | 3/1998 | Pan et al. | 257/433 |
| 5,744,848 | 4/1998 | Harazono | 257/433 |
| 5,841,178 | 11/1998 | Butrie et al. | 257/680 |

FOREIGN PATENT DOCUMENTS

| | | | |
|---|---|---|---|
| 40 2150073 | 6/1990 | Japan | 257/680 |
| 40 3126248 | 5/1991 | Japan | 257/680 |
| 40 4023469 | 1/1992 | Japan | 257/680 |

OTHER PUBLICATIONS

ASM Handbook, Formerly Tenth Edition, Metals Handbook, vol. 2, Properties and Selection: Nonferrous Alloys and Special–Purpose Materials, "Low Expansion Alloys", 1990, pp. 889–896.

ASM Handbook, Formerly Tenth Edition, Metals Handbook, vol. 2, Properties and Selection: Nonferrous Alloys and Special–Purpose Materials, "Shape Memory Alloys", 1990, pp. 897–902.

*Primary Examiner*—Donald L. Monin, Jr.
*Assistant Examiner*—Michael Dietrich
*Attorney, Agent, or Firm*—Gregory S. Rosenblatt Wiggin & Dana

[57] ABSTRACT

To hermetically seal an optically transparent ceramic or glass member to a metallic housing, an aperture with a diameter less than the diameter of the member is formed through the metallic housing. The member is then press-fit into the aperture, partially displacing metal from the walls of the aperture, forming an inner burr circumscribing the aperture. The walls of the aperture and the circumscribing burr are then coated with a second metal, preferably electroless nickel. The resultant seal maintains hermeticity following thermal cycling and is particularly suited for the manufacture of a hybrid electronic package having an optical or opto-electronic coupling.

9 Claims, 3 Drawing Sheets

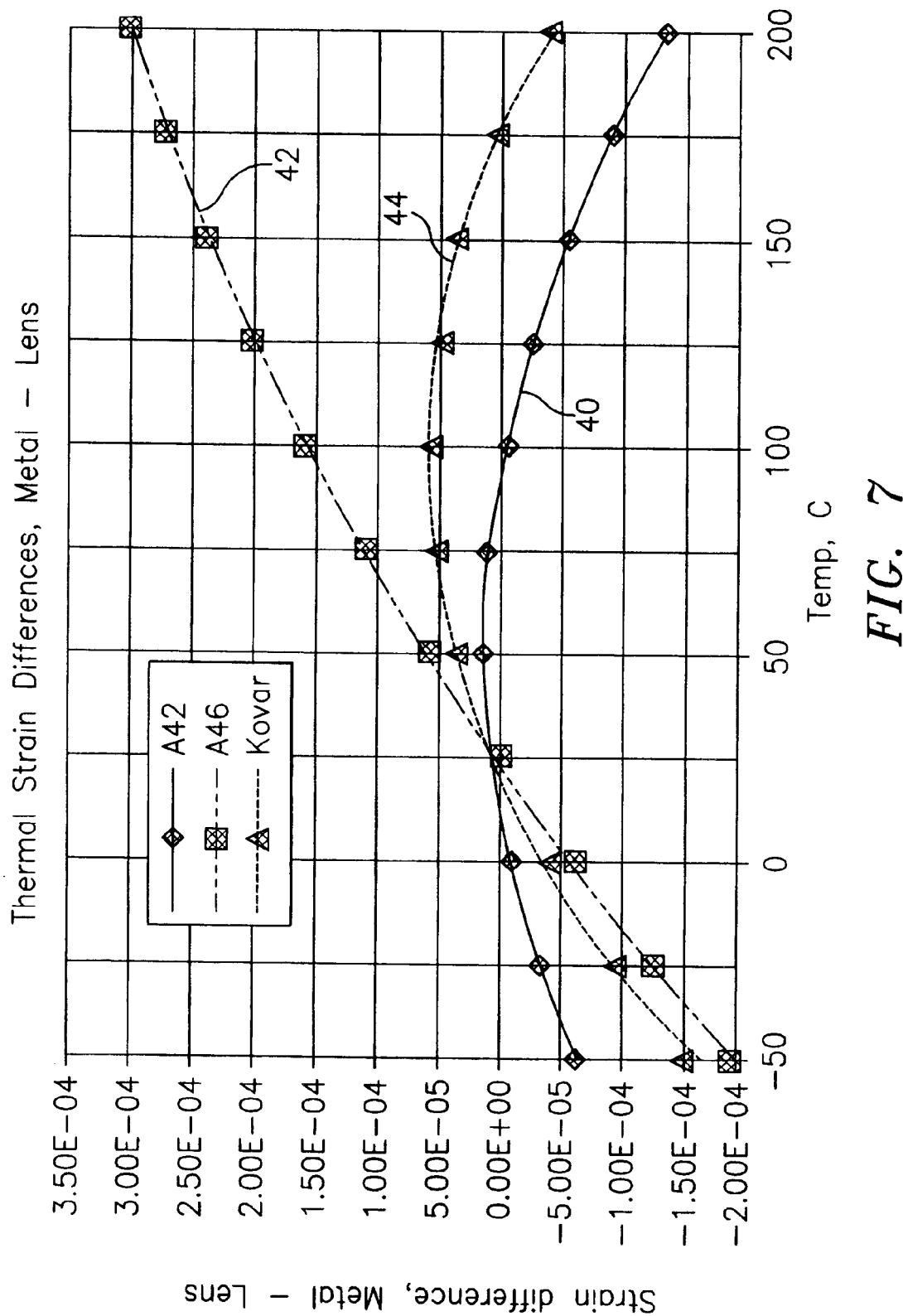

OPTICAL COMPONENT PACKAGE WITH A HERMETIC SEAL

This is a continuation application of provisional application U.S. Ser. No. 60/053,205 and claims priority thereto Provisional application Ser. No. 60/053,205 is incorporated in its entirety herein.

BACKGROUND OF INVENTION

1. Field of the Invention

This invention relates to a method for making a hermetic ceramic to metal seal. More particularly, an optically transparent ceramic lens is press-fit into an aperture formed in a metallic housing and a metallic coating layer then deposited on the aperture walls.

2. Description of Related Art

Hybrid electronic packages that incorporate an optical or opto-electronic component typically include a lens for receiving photonic signals and metallic leads for receiving electrical signals. To maintain the integrity of circuitry contained within the hybrid package, the package is hermetically sealed.

In the manufacture of one type of hybrid package, each metallic lead is surrounded by a glass bead and the assembly is inserted into an aperture extending through a metallic housing. When heated to above about 800° C., the glass melts and fuses to both the lead and the housing forming a hermetic glass to metal seal that also electrically isolates the leads from the housing.

For optical devices, a lens is included. The lens is formed from an optically transparent glass or ceramic and is coated with an anti-reflective coating. To maintain the effectiveness of the anti-reflective coating, the lens cannot be exposed to temperatures above about 500° C. This temperature exposure limitation prevents the lens from being joined to the hybrid package housing by a conventional glass to metal seal.

U.S. Pat. No. 5,177,806 to Abbott et al., that is incorporated by reference in its entirety herein, discloses that optical fibers have been bonded with metallic solders and epoxy resins. While both metallic solders and epoxy resins may be applied at temperatures well below 500° C., the hermeticity of hybrid packages using these sealants is suspect and not adequate for the housing of complex integrated circuits.

There remains, therefore, a need for a method to make a ceramic to metal seal such that an optically transparent lens can be joined to a metallic housing that meets the dual objectives of an assembly temperature of less than 500° C. and hermeticity acceptable for integrated circuit packages.

SUMMARY OF THE INVENTION

Accordingly, it is an object of the invention to provide a process for the manufacture of a hermetic ceramic to metal seal. Among the features of the process of the invention are that an optically transparent ceramic member is press-fit into an aperture formed through a hybrid semiconductor package. A metallic coating layer is then deposited on the surfaces of aperture.

Among the advantages of the invention are that the seal between the optically transparent ceramic member and the housing of the hybrid semiconductor package is hermetic and effectively prevents the ingress of moisture into the hybrid package. This makes a package particularly suitable for housing semiconductor devices. A further advantage of the process of the invention is that the ceramic to metal seal is formed at a temperature of less than about 100° C., avoiding thermal degradation of an anti-reflective coating applied to the optically transparent ceramic and of the other package components.

The above stated objects, features and advantages will become more apparent from the specification and drawings that follow.

IN THE DRAWINGS

Figure 6:
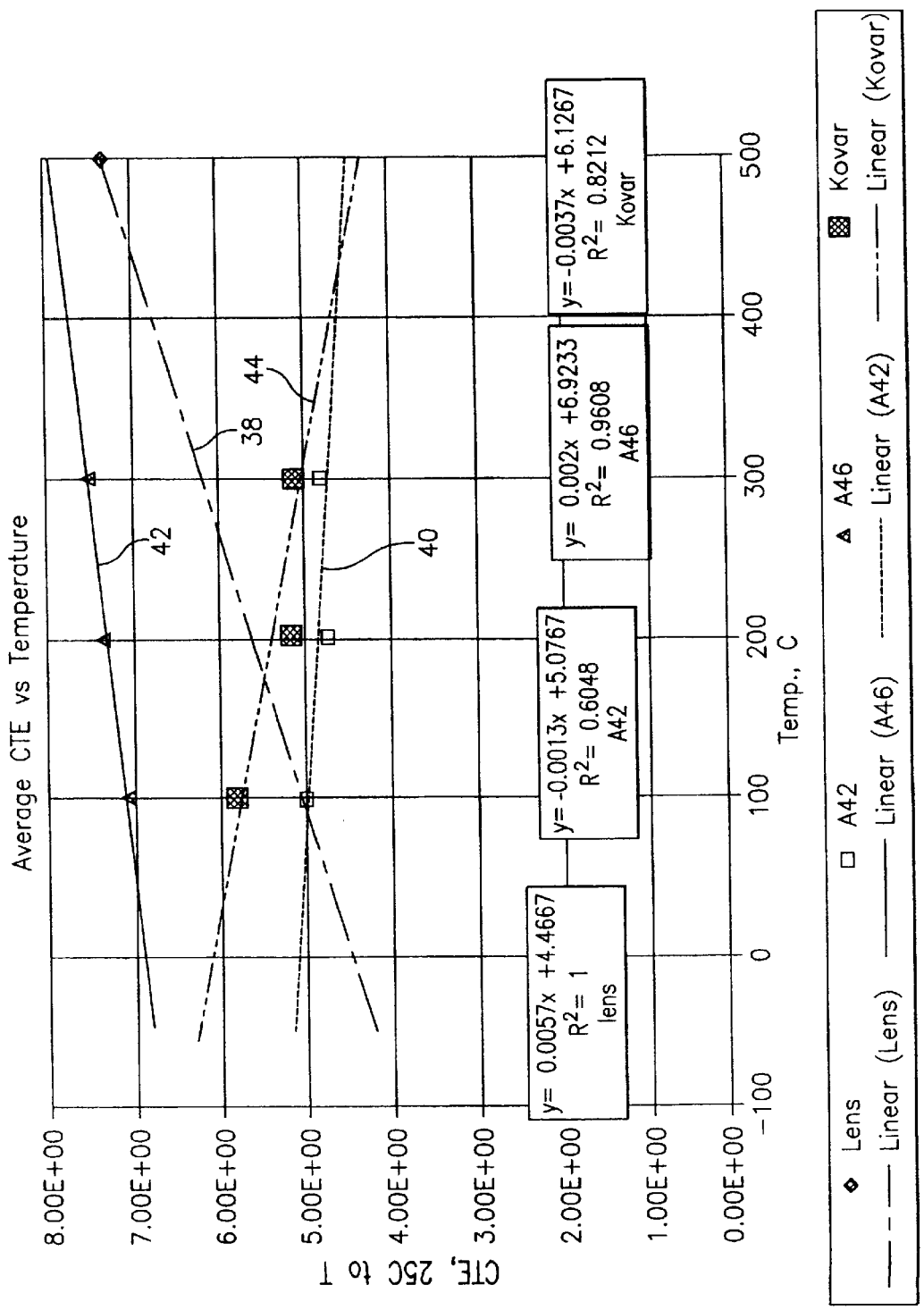

FIG. 6 graphically compares the coefficient of thermal expansion of an optically transparent member to a number of low coefficient of thermal expansion metals.

FIG. 7 graphically compares the thermal strain developed in a number of laminates containing an optically transparent member and a low coefficient of thermal expansion metal.

DETAILED DESCRIPTION

Figure 1:
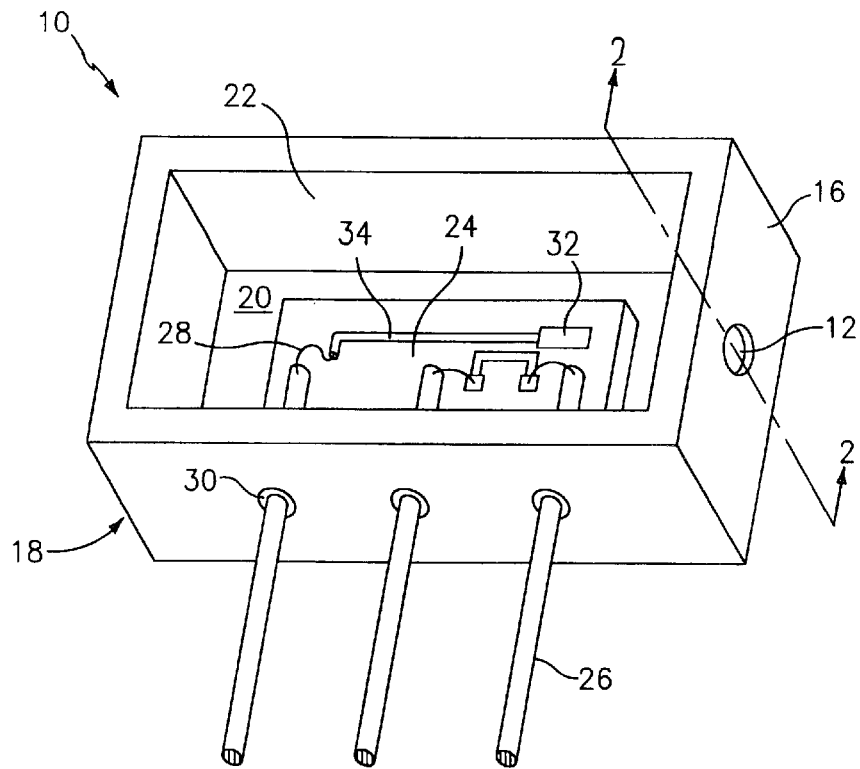
FIG. 1 is a perspective illustration of a hybrid package as known from the prior art.
Figure 2:
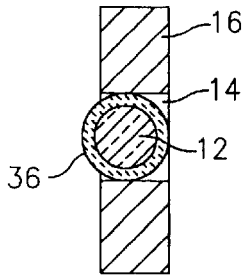
FIG. 2 illustrates in cross-section the insertion of an optically transparent lens into the hybrid package of FIG. 1.

A hybrid package for housing one or more semiconductor devices having both photonic and electronic inputs/outputs is described with reference to FIGS. 1 and 2. The hybrid package 10 includes an optically transparent member 12 contained within an aperture 14 formed through a wall 16 of the package.

A metallic housing 18 has a base 20 and projecting walls 16 that define a cavity 22. The housing 18 is preferably a unitary structure, as opposed to a brazed or soldered assembly to improve hermeticity. Typically, the housing 18 is formed by a process such as machining or injection molding and is formed from a metal having a relatively low coefficient of thermal expansion. Metals used for the housing 18 include "KOVAR" (trademark of Carpenter Steel), an alloy having the nominal composition, by weight, of 29% nickel, 17% cobalt and the balance iron, and other low coefficient of thermal expansion iron base expansion alloys. One or more electronic devices 24, having both electrically and optic, or electro-optic, features, are mounted to the base 20. Typically, the electronic device is a silicon based semiconductor device containing a plurality of integrated circuits.

Electrically conductive leads 26, that may be copper, a copper alloy, or a low expansion electrically conductive metal such as Kovar, extend through the housing 16 and are electrically interconnected to the electronic device 24 through small diameter wires 28 or other suitable electrical interconnections. The leads 26 are electrically isolated from the walls 16 of the metallic housing 18 by glass beads 30.

An aperture 14 formed in one or more of the walls 16 further contains an optically transparent member 12. The optically transparent member 12, such as a lens, transmits photonic signals from a fiber optic cable or other optic device to an optically active portion 32 of the electronic device 24. Circuit traces 34 formed on an electrically active surface of the electronic device 24 then electrically interconnect the optically active portion 32 with electrically active portions of the hybrid electronic package.

The optically transparent member 12 is formed from any suitable ceramic or glass. By "optically transparent" it is meant that light of a desired wavelength will pass through the member with minimal distortion or attenuation. One suitable material is magnesium aluminate ($MgAl_2O_4$ also referred to as Spinel). Other suitable materials for the optically transparent member include crystalline carbon (diamond), aluminum oxide (sapphire) and aluminum oxide+chromium (ruby). Generally, the selection of the optically transparent material is dependent on the wavelength of light to be transmitted and the coefficients of thermal expansion of the housing and of the member.

The optically transparent member 12 is coated with a thin anti-reflective coating 36 to prevent extraneous optical signals from sending spurious messages to the optically active portion 32. The anti-reflective coating 36 may be magnesium fluoride, silicon monoxide, zirconium oxide, titanium oxide or any other suitable metal oxide or organic coating as known in the art.

To maintain the effectiveness of the anti-reflective coating, the optically transparent member 12 should not be exposed to temperatures above 500° C. Glass to metal seals requiring a sealing temperature in excess of 800° C. are not an option. Conventional low temperature sealants such as epoxies and solders do not provide the required hermeticity.

Hermeticity is the capability to prevent the flow of air or gas in or out of an enclosure. Hermeticity is of concern in electronic packaging since small amounts of water vapor can corrode small diameter wires and circuit traces, causing the electronic device to fail. In accordance with Military Specification 883E, Method 1014, hermeticity is typically evaluated by helium mass spectroscopy. A helium gas is applied to one side of the package and a vacuum drawn on an opposing side. By mass spectroscopy, the rate of helium leakage through the package is determined. A package is deemed "hermetic" if a leak rate of less than $1 \times 10^{-8}$ atmospheres per cubic centimeter helium (atm/cc He) is detected.

Figure 3:
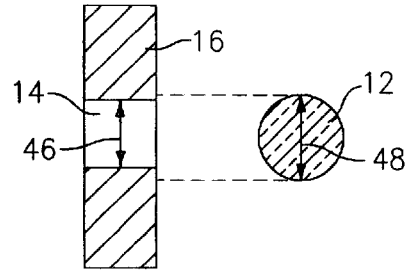
FIGS. 3–5 illustrate a method for achieving a hermetic ceramic to metal seal in accordance with the invention.
Figure 4:
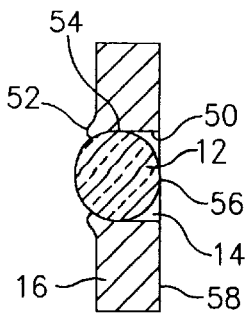
Figure 5:
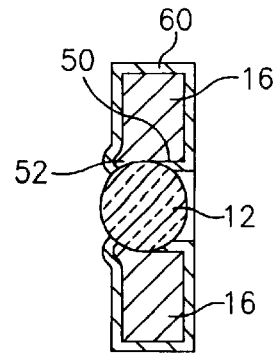

FIGS. 3–5 illustrate a process for making a hermetic seal between an optically transparent ceramic or glass member 12 and a wall 16 of a metallic housing. The metallic housing is preferably formed from alloy 42, an iron/nickel alloy containing 42%, by weight, of nickel and the balance iron. Other low expansion iron base alloys such as Invar (nominal composition by weight of 64% iron and 36% nickel), Kovar and alloy 46 (nominal composition by weight of 46% nickel, balance iron) are also acceptable, but less preferred. The preference for alloy 42 is best illustrated with reference to FIGS. 6 and 7.

FIG. 6 graphically illustrates the coefficient of thermal expansion of magnesium aluminate (reference line 38) and compares the coefficient of thermal expansions of the ceramic to that of alloy 42 (reference line 40), alloy 46 (reference line 42) and Kovar (reference line 44). Below about 85° C., all three metals have coefficients of thermal expansion greater than the ceramic. Between 85° C. and about 175° C., only alloy 42 has a coefficient of thermal expansion less than that of the ceramic. Above 175° C., both Kovar and alloy 42 have lower coefficients of thermal expansion. Alloy 46 has a coefficient of thermal expansion above that of the ceramic over the entire temperature range of 0°–500° C.

If the ceramic to metal seal is viewed as a 3-layer laminate, metal/ceramic/metal, and assumed to be stress-free at a temperature of 25° C., FIG. 7 illustrates the strain difference between the metal and the ceramic. For values less than zero, the ceramic is in compression and for values above zero, the ceramic is in tension. Brittle ceramics and glasses withstand a much higher compressive force without fracture than a tensile force. Accordingly, it is desired to maintain the ceramic lens in compression to the largest extent possible. As illustrated in FIG. 7, only alloy 42 (reference line 40) achieves this objective.

In a preferred embodiment, the strain difference between the metal and the ceramic should be between $-1 \times 10^{-4}$ and $+1 \times 10^{-4}$ when the temperature is varied from either +25° C. to +150° C. or from +25° C. and −50° C. More preferably, the strain difference should be less than about $+2.5 \times 10^{-5}$.

Referring back to FIG. 3, in the process for making hermetic seals in accordance with the invention, aperture 14 is extended through the wall 16. The aperture is formed by any suitable process such as mechanical drilling or laser ablation. Alternatively, the aperture 12 is molded directly into an injection molded housing.

Notwithstanding the method of manufacture, the aperture has a diameter 46 that is less than the diameter 48 of the optically transparent member 12. While described as a diameter, and typically both the aperture and the optically transparent member are circular in cross section, any suitable axial length may be substituted for the diameter, dependent on the ultimate configuration of the aperture and optically transparent member. For example, for rectangular members, length and width may be appropriate substitutes for diameter.

Typically, the diameter 46 of the aperture 14 is from about 0.0005 inch to about 0.005 inch and preferably from about 0.0015 inch to about 0.0025 inch less than the diameter 48 of the optically transparent member 12.

Referring now to FIG. 4, the optically transparent member 12 is mechanically forced into the aperture 14. Any suitable press may be employed, for example, an arbor press or a hydraulic press. Since the diameter of the optically transparent member is larger than the diameter of the aperture, insertion of the member into the aperture 14 deforms the walls 50 of the aperture 14 outwardly from the member 12. Inwardly from the member, a small, on the order of less than about 0.005 inch, burr 52 is extruded and circumscribes the optically transparent member 12.

The optically transparent member 12 is inserted to an intermediate point 54 within the aperture. Generally, the intermediate point 54 is selected so that a tangent to the surface 56 of the member is co-planar with a surface 58 on the exterior of the wall 16.

Referring now to FIG. 5, at least the walls 50 of the aperture 14 and the burr 52 are next coated with a metallic coating 60 to a thickness of from about 50 microinches to about 350 microinches and preferably from about 75 microinches to about 150 microinches. The metallic coating 60 has a minimum thickness that is effective to hermetically seal the ceramic member 12 to the wall 16 of the metallic housing. The metallic constituent 60 coats at least the walls 50 and burr 52 formed from the walls of the metallic constituent and preferably, the entire metallic housing.

Any suitable metallic coating may be employed. One preferred coating is nickel deposited from a chemical solution by electroless means. However, other deposition processes such as vapor deposition and electrolytic coating may be employed.

One preferred chemical solution for electroless deposition of the nickel is an aqueous solution containing nickel ions and sodium hypophosphite referred to as an autocatalytic phosphorous bath. The metallic housing is first degreased by immersion in a hot aqueous alkaline cleaning solution and then immersed in the plating solution at a temperature of 180° F. for between 15 and 30 minutes to deposit a metallic coating having an approximate thickness of 120 microinches.

Optionally, the nickel coating may be coated with an oxidation resistant layer or a solderable layer, such as gold.

The advantages of the process of the invention are illustrated by the Examples that follow.

EXAMPLES

Example 1

Lenses formed from spherical magnesium aluminate with a diameter of 0.031 inch were press-fit into apertures formed in an alloy 42 metallic housing. When the aperture in the housing was 0.030 inch, the press-fit lens did not have an acceptable hermeticity value as specified by Military Specification 883C. When the aperture diameter was reduced to 0.029 inch, ten out of ten press-fit lenses formed hermetic seals. This indicates that the diameter of the aperture in the metallic housing should be at least about 0.0015 inch less than the diameter of the ceramic member.

Example 2

Kovar and alloy 42 metallic housings were provided with apertures 0.029 inch in diameter. Optically transparent magnesium aluminate spheres having a diameter of 0.031 inch were press-fit into the apertures. The hermeticity was then evaluated at four stages during the process. Stage 1 was "as pressed". Stage 2 was after coating with nickel, by either an electroless or an electrolytic process, as specified. Stage 3 was after a 400° C. thermal shock. Stage 4 was after 15 cycles of thermal cycling between a liquid at −65° C. and a second liquid at +150° C. As indicated in Table 1, only the combination of an alloy 42 housing and an electroless nickel coating achieved the required hermeticity following thermal cycling. Table 1 presents results as number of packages hermetic to $1 \times 10^{-8}$ atm/cc He/number of packages tested (pass/tested).

TABLE 1

| | | HERMETIC TO $1 \times 10^{-8}$ atm/cc He | | | |
|---|---|---|---|---|---|
| HOUS-ING | COAT-ING | AS PRESSED | AS PLATED | FIRE @ 400° C. | THERMAL CYCLE |
| Kovar | None | 5/10 | — | — | — |
| Kovar | Electroless nickel | 5/10 | 10/10 | 10/10 | 4/10 |
| Alloy-42 | None | 10/10 | — | — | — |
| Alloy-42 | Electrolytic nickel | 10/10 | 10/10 | 10/10 | 6/10 |
| Alloy-42 | Electroless nickel | 10/10 | 10/10 | 10/10 | 10/10 |

It is apparent that there has been provided in accordance with the invention a process for making an hermetic seal between a ceramic or glass member and a metallic housing that fully satisfies the objects, means and advantages set forth hereinabove. While the invention has been described in combination with embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

We claim:

1. A hybrid electronic package, comprising:

a unitary metallic housing formed from a metal having a first coefficient of thermal expansion with an aperture of a first diameter extending through a wall of said metallic housing;

an optically transparent member inserted into said aperture and contacting said aperture at an intermediate point thereof wherein the diameter of said aperture is equal to the diameter of said optically transparent member outward from said intermediate point and essentially conforms to said optically transparent member inward of said intermediate point;

a metallic burr extending from an inner surface of said aperture and circumscribing said aperture; and a metallic coating of a second metal coating the walls of said aperture and said circumscribing burr, except for where said aperture contacts said optically transparent member.

2. The hybrid electronic package as claimed in claim 1 wherein the metallic layer is approximately between 50 microinches and 350 microinches thick.

3. The hybrid electronic package as claimed in claim 2 wherein the metallic layer is formed by a process selected from the group consisting of vapor deposition and electrolytic coating.

4. The hybrid electronic package as claimed in claim 1 wherein the metallic layer provides a hermetic seal between the optically transparent member and the wall of the metallic housing.

5. The hybrid electronic package as claimed in claim 1 wherein the optically transparent member is fabricated from a material selected from the group consisting of magnesium aluminate, crystalline carbon, aluminum oxide and ruby.

6. The hybrid electronic package as claimed in claim 1 wherein the optically transparent member is coated with an anti-reflective coating.

7. The hybrid electronic package as claimed in claim 6 wherein the anti-reflective coating is fabricated from a material selected from the group consisting of magnesium fluoride, silicon monoxide, zirconium oxide and titanium oxide.

8. The hybrid electronic package as claimed in claim 1 wherein the aperture has a diameter of from approximately 0.0005 inch to 0.005 inch.

9. The hybrid electronic package as claimed in claim 1 wherein the first diameter is less than the second diameter.

* * * * *